US012688894B2

(12) United States Patent
Li et al.

(10) Patent No.: US 12,688,894 B2
(45) Date of Patent: Jul. 21, 2026

(54) REDUCING INTERFERENCE METHODS FOR 3D MULTIPLE-CHANNEL MEMORY DEVICES

(71) Applicant: Sandisk Technologies, Inc., Milpitas, CA (US)

(72) Inventors: Will Li, Shanghai (CN); Liang Li, Shanghai (CN); Vincent Yin, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 102 days.

(21) Appl. No.: 18/737,813

(22) Filed: Jun. 7, 2024

(65) Prior Publication Data

US 2025/0378886 A1      Dec. 11, 2025

(51) Int. Cl.
*G11C 16/26*          (2006.01)
*G11C 16/10*          (2006.01)
(52) U.S. Cl.
CPC ............ *G11C 16/26* (2013.01); *G11C 16/102* (2013.01)
(58) Field of Classification Search
CPC .............................. G11C 16/26; G11C 16/102
See application file for complete search history.

(56) References Cited

U.S. PATENT DOCUMENTS

| | | | |
|---|---|---|---|
| 7,239,551 B2 | 7/2007 | Cernea et al. | |
| 11,716,847 B2 | 8/2023 | Gao et al. | |
| 11,970,380 B2 | 4/2024 | Muszinski et al. | |
| 2016/0180934 A1* | 6/2016 | Sakui ................ | G11C 16/3459 |
| | | | 365/185.11 |
| 2022/0123004 A1* | 4/2022 | Liu ........................ | G11C 5/025 |

OTHER PUBLICATIONS

Fan, et al.; "Adaptive Bitline Voltage Countermeasure for Neighbor Wordline Interference in 3D NAND Flash Memory-Based Sensors". Sensors 2023, Iss. 6, vol. 23, 3212. https://doi.org/10.3390/s23063212.

* cited by examiner

*Primary Examiner* — Xiaochun L Chen
(74) *Attorney, Agent, or Firm* — Dickinson Wright PLLC

(57)          ABSTRACT

Embodiments disclosed herein are directed to techniques aimed at managing interference in a 3D NAND memory with a split or multiple channel configuration. Specially, it addresses the issue of program interference, where a programmed memory cell experiences disturbance from another cell within a closely configured environment.

20 Claims, 20 Drawing Sheets

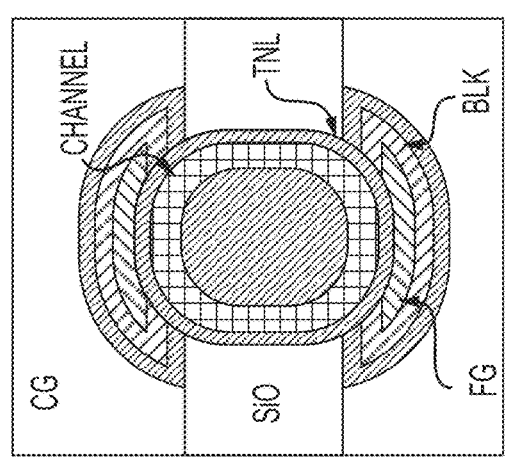
*FIG. 15B*
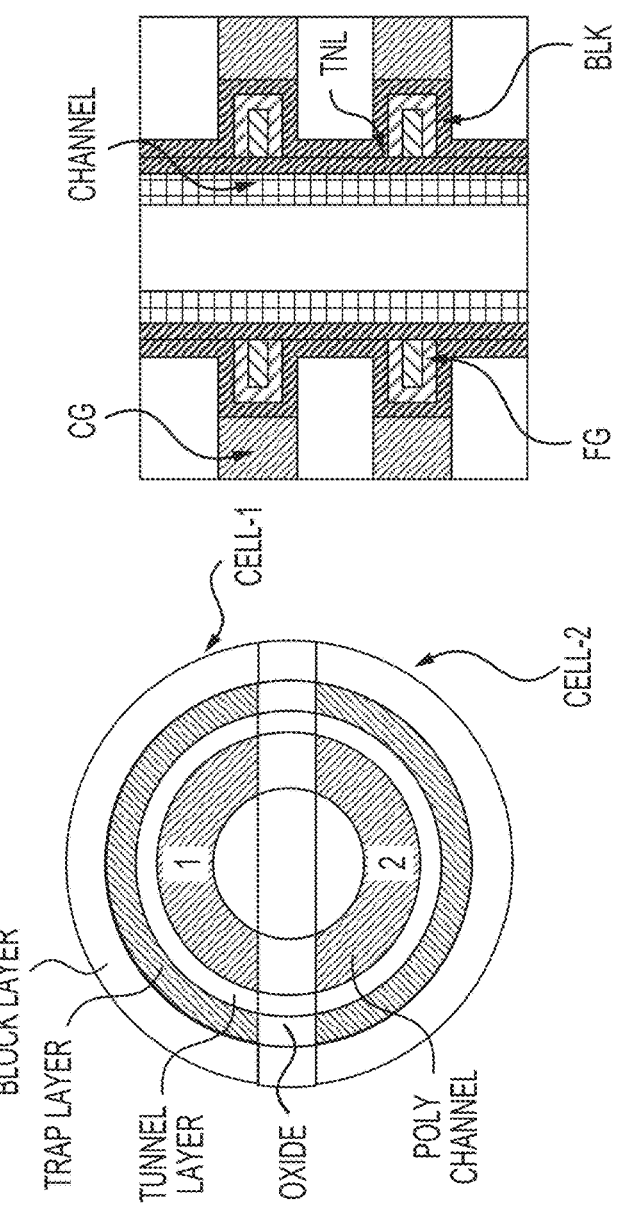
*FIG. 15A*
*FIG. 14*

| DIVIDE ZONE | | WLn OPPOSING CELL-2 STATE | |
|---|---|---|---|
| | | LOW | HIGH |
| WLn+1 STATE | LOW | 4 | 3 |
| | HIGH | 2 | 1 |

| DIVIDE ZONE BASED ON LAA | | WLn OPPOSING CELL-2 STATE | | |
|---|---|---|---|---|
| | | LOW | MEDIUM | HIGH |
| WLn+1 STATE | LOW | 4 | 3 | 3 |
| | MEDIUM | 2 | 1 | 1 |
| | HIGH | 2 | 1 | 1 |

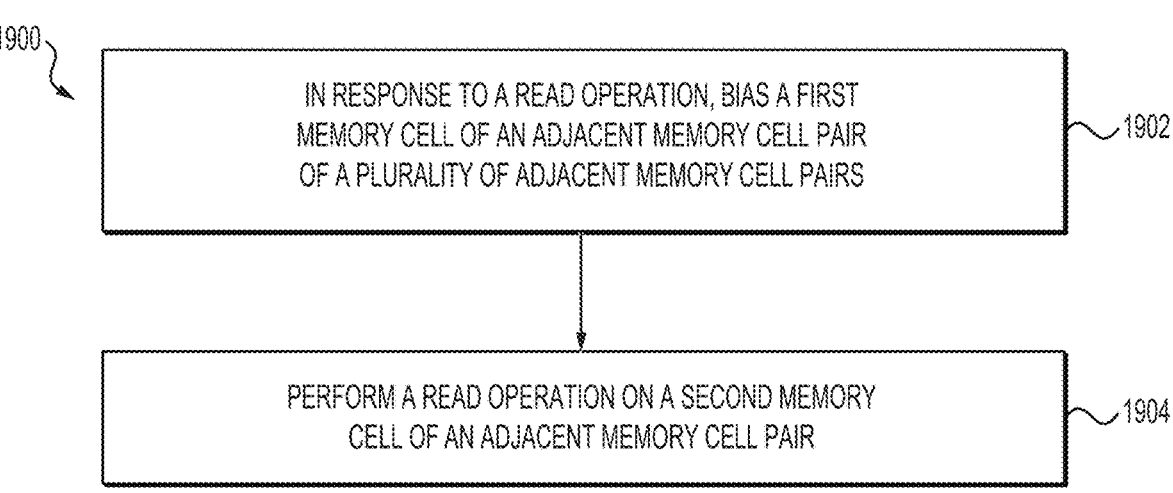

1900

IN RESPONSE TO A READ OPERATION, BIAS A FIRST
MEMORY CELL OF AN ADJACENT MEMORY CELL PAIR
OF A PLURALITY OF ADJACENT MEMORY CELL PAIRS

1902

PERFORM A READ OPERATION ON A SECOND MEMORY
CELL OF AN ADJACENT MEMORY CELL PAIR

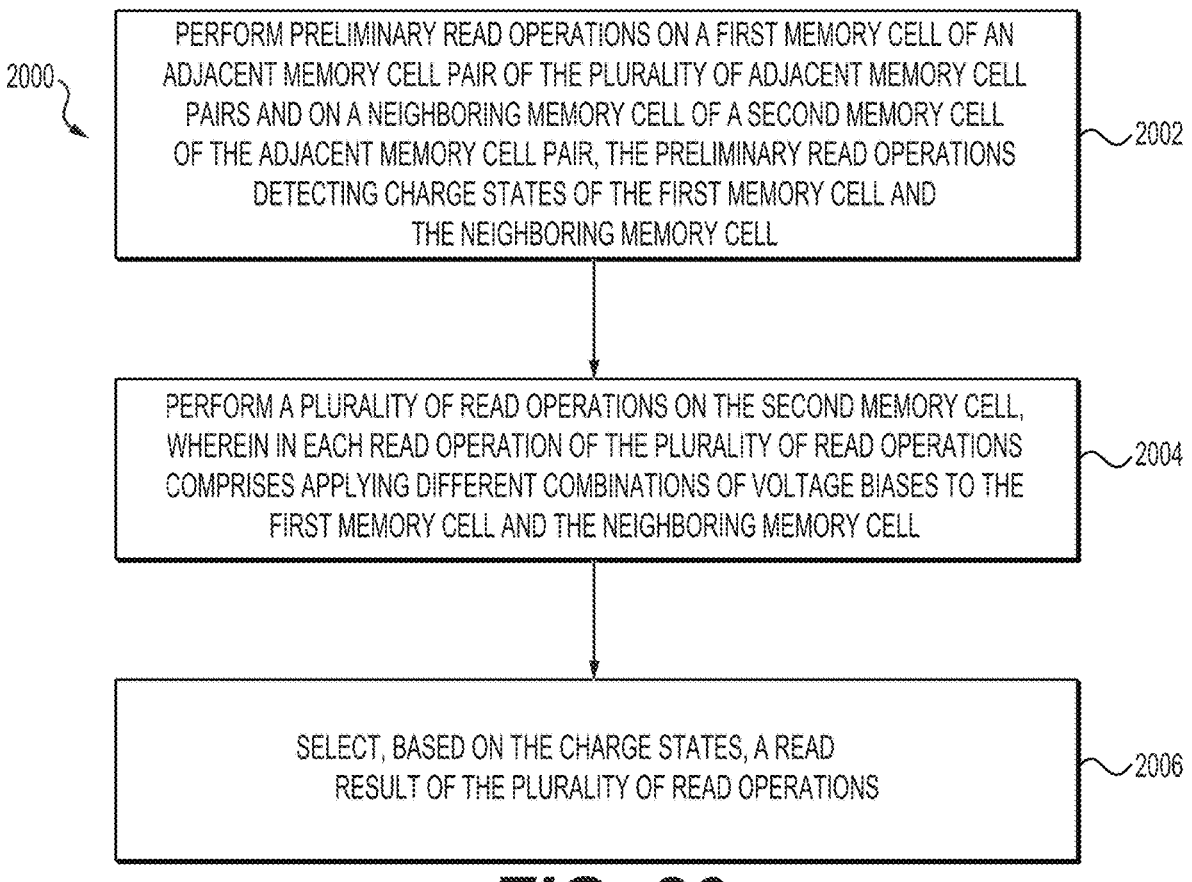

2000

PERFORM PRELIMINARY READ OPERATIONS ON A FIRST MEMORY CELL OF AN
ADJACENT MEMORY CELL PAIR OF THE PLURALITY OF ADJACENT MEMORY CELL
PAIRS AND ON A NEIGHBORING MEMORY CELL OF A SECOND MEMORY CELL
OF THE ADJACENT MEMORY CELL PAIR, THE PRELIMINARY READ OPERATIONS
DETECTING CHARGE STATES OF THE FIRST MEMORY CELL AND
THE NEIGHBORING MEMORY CELL

2002

PERFORM A PLURALITY OF READ OPERATIONS ON THE SECOND MEMORY CELL,
WHEREIN IN EACH READ OPERATION OF THE PLURALITY OF READ OPERATIONS
COMPRISES APPLYING DIFFERENT COMBINATIONS OF VOLTAGE BIASES TO THE
FIRST MEMORY CELL AND THE NEIGHBORING MEMORY CELL

2004

SELECT, BASED ON THE CHARGE STATES, A READ
RESULT OF THE PLURALITY OF READ OPERATIONS

REDUCING INTERFERENCE METHODS FOR 3D MULTIPLE-CHANNEL MEMORY DEVICES

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

SUMMARY

This section provides a general summary of the present disclosure and is not a comprehensive disclosure of its full scope or all of its features and advantages.

An object of the present disclosure is to provide a memory apparatus and a method of operation of the memory apparatus that address and overcome shortcomings described herein.

Accordingly, it is an aspect of the present disclosure to a semiconductor device. The semiconductor device comprises a substrate and a three-dimensional memory array disposed on the substrate. The three-dimensional memory array comprises a plurality of memory cell stacks aligned along a vertical direction perpendicular to the substrate, where each stack of the plurality of memory cell stacks including multiple, connected memory cells arranged in layers, each layer forming a plane perpendicular to the vertical direction of the plurality of memory cell stacks, and adjacent memory cell stacks of the plurality of memory cell stacks are configured such that each memory cell in a given layer of a first memory cell stack of the plurality of memory cell stacks is adjacent to a corresponding memory cell in a same layer of a second memory cell stack of the plurality of memory cell stacks forming a plurality of adjacent memory cell pairs. Each adjacent memory cell pair of a plurality of adjacent memory cell pairs are separated by a non-conductive layer. The semiconductor device further comprising a control circuit configured to: in response to a read operation, bias a first memory cell of an adjacent memory cell pair of the plurality of adjacent memory cell pairs; and perform a read operation on a second memory cell of an adjacent memory cell pair Accordingly, it is another aspect of the present disclosure a method of operating a non-volatile semiconductor memory device. The method comprises: performing preliminary read operations on a first memory cell of an adjacent memory cell pair of a plurality of adjacent memory cell pairs and on a neighboring memory cell of a second memory cell of the adjacent memory cell pair, where the neighboring memory cells is located immediately adjacent to the second memory cell in a same memory cell stack of a plurality of memory cell stacks and the preliminary read operations detect charge states of the first memory cell and the neighboring memory cell. Adjacent memory cell stacks of the plurality of memory cell stacks are configured such that each memory cell in a given layer of a first memory cell stack of the plurality of memory cell stacks is adjacent to a corresponding memory cell in a same layer of a second memory cell stack of the plurality of memory cell stacks forming the plurality of adjacent memory cell pairs. Each adjacent memory cell pair of the plurality of adjacent memory cell pairs are separated by a non-conductive layer. The method further comprises performing a plurality of read operations on the second memory cell, wherein in each read operation of the plurality of read operations comprises applying different combinations of voltage biases to the first memory cell and the neighboring memory cell; and selecting, based on the charge states, a read result of the plurality of read operations.

Accordingly, it is another aspect of the present disclosure to an apparatus comprises: a substrate and a three-dimensional memory array disposed on the substrate, The three-dimensional memory array comprises: a plurality of memory cell stacks aligned along a vertical direction perpendicular to the substrate, where each stack of the plurality of memory cell stacks including multiple, connected memory cells arranged in layers, each layer forming a plane perpendicular to the vertical direction of the plurality of memory cell stacks and where adjacent memory cell stacks of the plurality of memory cell stacks are configured such that each memory cell in a given layer of a first memory cell stack of the plurality of memory cell stacks is adjacent to a corresponding memory cell in a same layer of a second memory cell stack of the plurality of memory cell stacks forming a plurality of adjacent memory cell pairs. Each adjacent memory cell pair of a plurality of adjacent memory cell pairs are separated by a non-conductive layer. The apparatus further comprising: a means for biasing a first memory cell of an adjacent memory cell pair of the plurality of adjacent memory cell pairs in response to a read operation; and a means for performing a read operation on a second memory cell of an adjacent memory cell pair.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

For a detailed description of example embodiments, reference will now be made to the accompanying drawings in which:

FIG. 14 provides a top-down view of a cross-section of a memory cell, in accordance with embodiments described herein;

FIG. 15A is a cross-sectional view of a pair of memory cells constructed according to an exemplary embodiment;

FIG. 15B is a cross-sectional view of a memory cell constructed according to the exemplary embodiment;

FIGS. 19 and 20 illustrate exemplary methods for managing interference in a 3D NAND memory, in accordance with embodiments described herein.

DETAILED DESCRIPTION

Figures 1A, 1B:
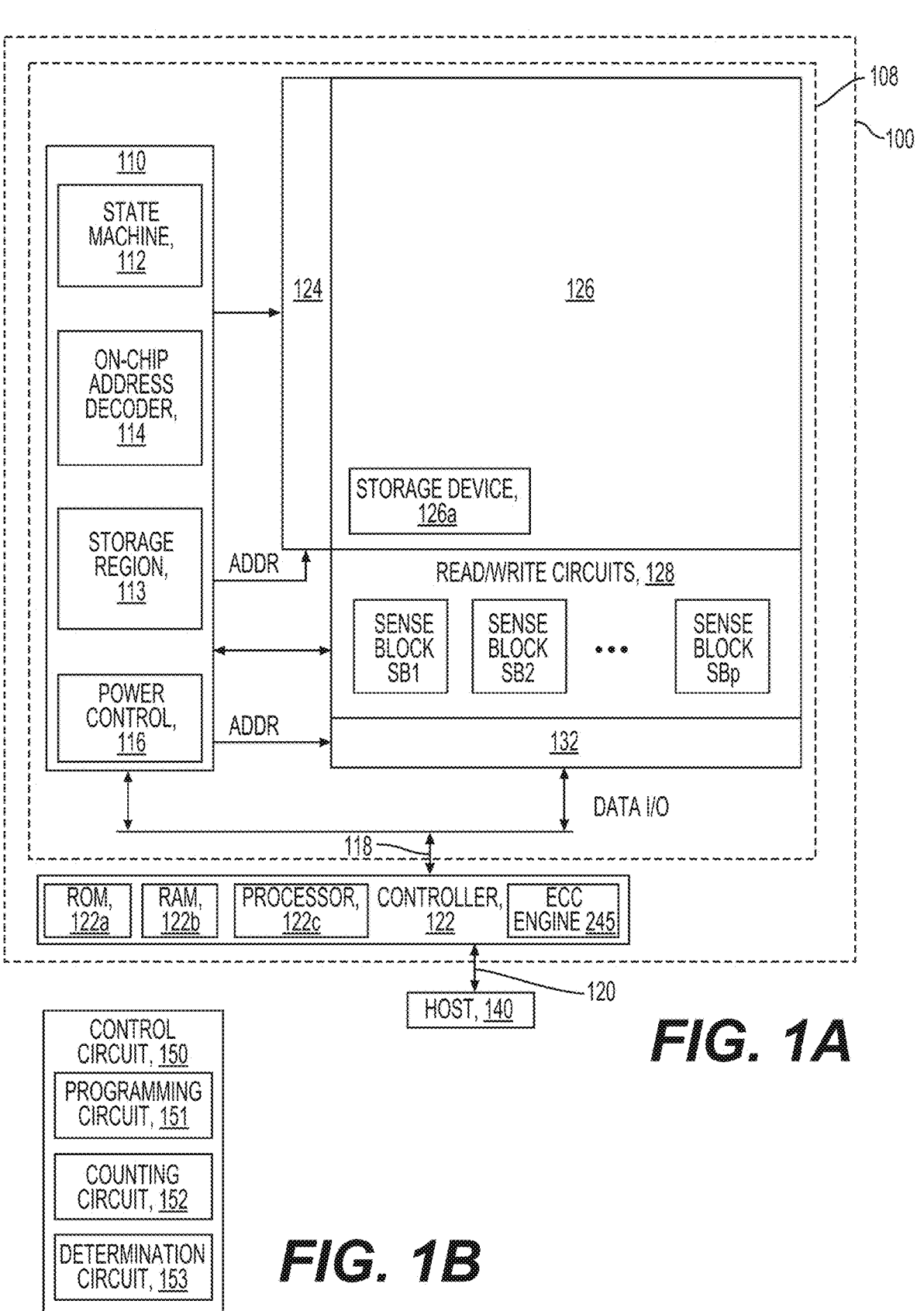
FIG. 1A is a block diagram of an example memory device.
FIG. 1B is a block diagram of an example control circuit which comprises a programming circuit, a counting circuit, and a determination circuit.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to program memory cells of a word line of a block and verify the set of the memory cells. The control circuits can also include a counting circuit configured to determine a number of memory cells that are verified to be in a data state. The control circuits can also include a determination circuit configured to determine, based on the number, whether the block is faulty.

For example, FIG. 1B is a block diagram of an example control circuit 150 which comprises a programming circuit 151, a counting circuit 152 and a determination circuit 153. The programming circuit may include software, firmware and/or hardware. The counting circuit may include software, firmware and/or hardware which implements. The determination circuit may include software, firmware and/or hardware which implements.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller 122 to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

In embodiments, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The smallest piece of a NAND flash die is a cell, and each cell is stored in a page. Each page can be written to, and they are the smallest piece of the NAND flash that can store data or be programmed. Groups of pages are called blocks. There may be over 100 pages in each block. Because multiple pages are contained in each block, blocks can store a large amount of data. When it is necessary to erase part of the data stored in the NAND flash memory, it can only be erased by block. It is not possible to erase smaller or larger groups of data within a NAND flash die.

When blocks are grouped together, they form planes. Planes then form NAND flash dies. Dies can contain a single plane full of data blocks, or they may feature multiple planes that have been linked together. The number and configurations of planes within the NAND flash die is adaptable.

Further, the memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
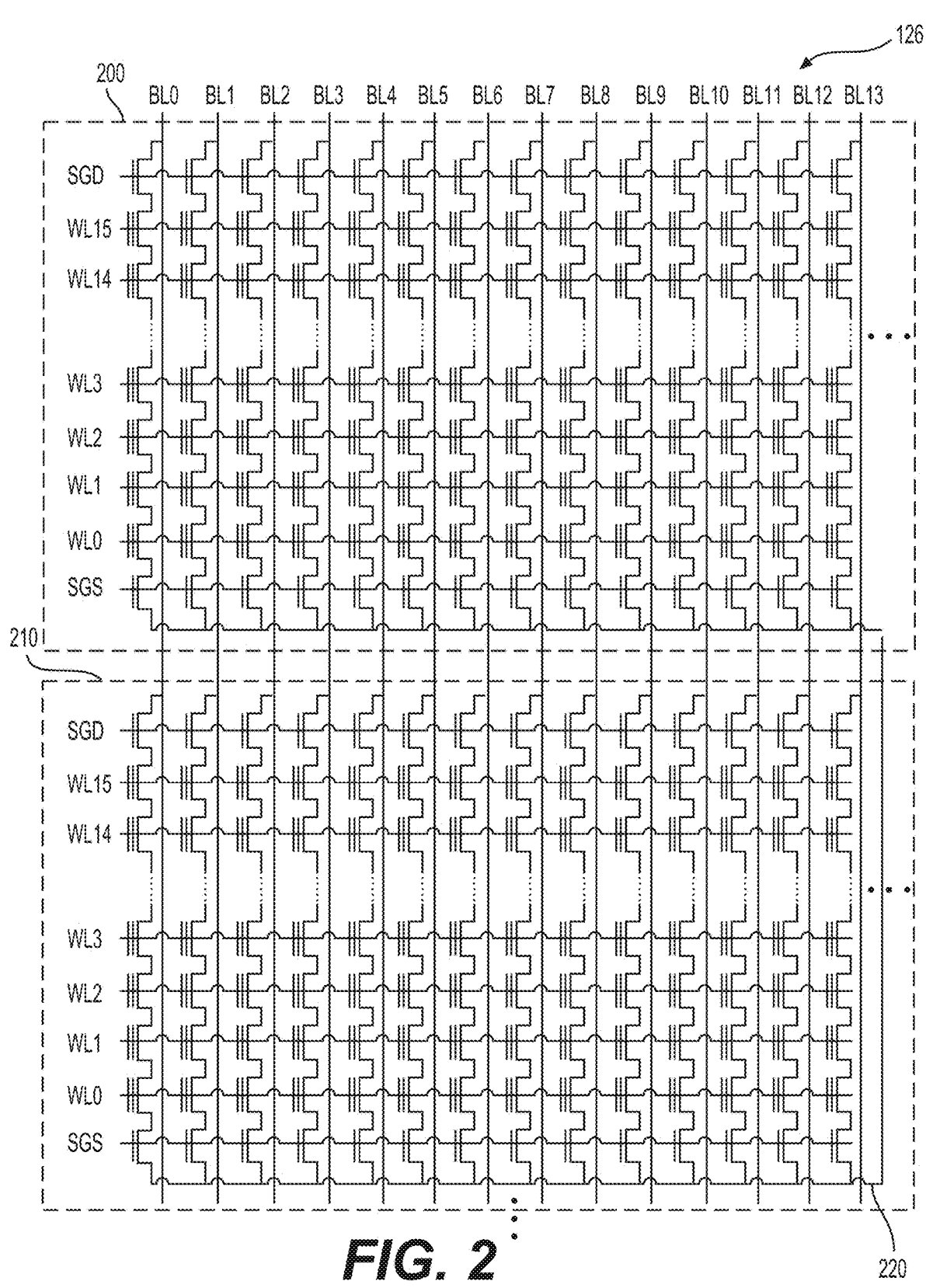
FIG. 2 depicts blocks of memory cells in an example two-dimensional configuration of the memory array of FIG. 1.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
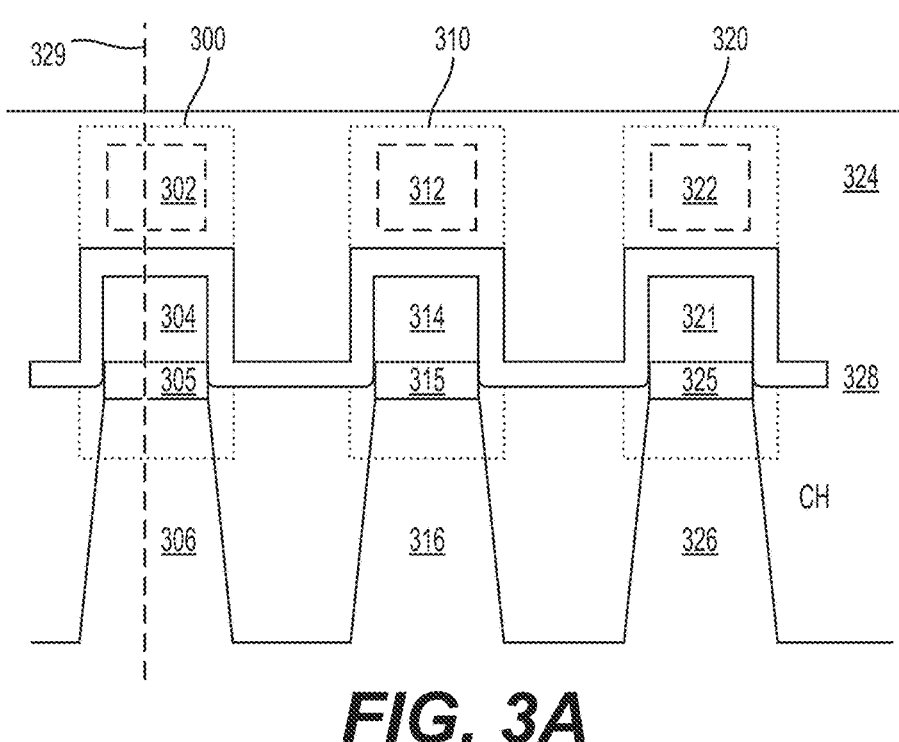
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
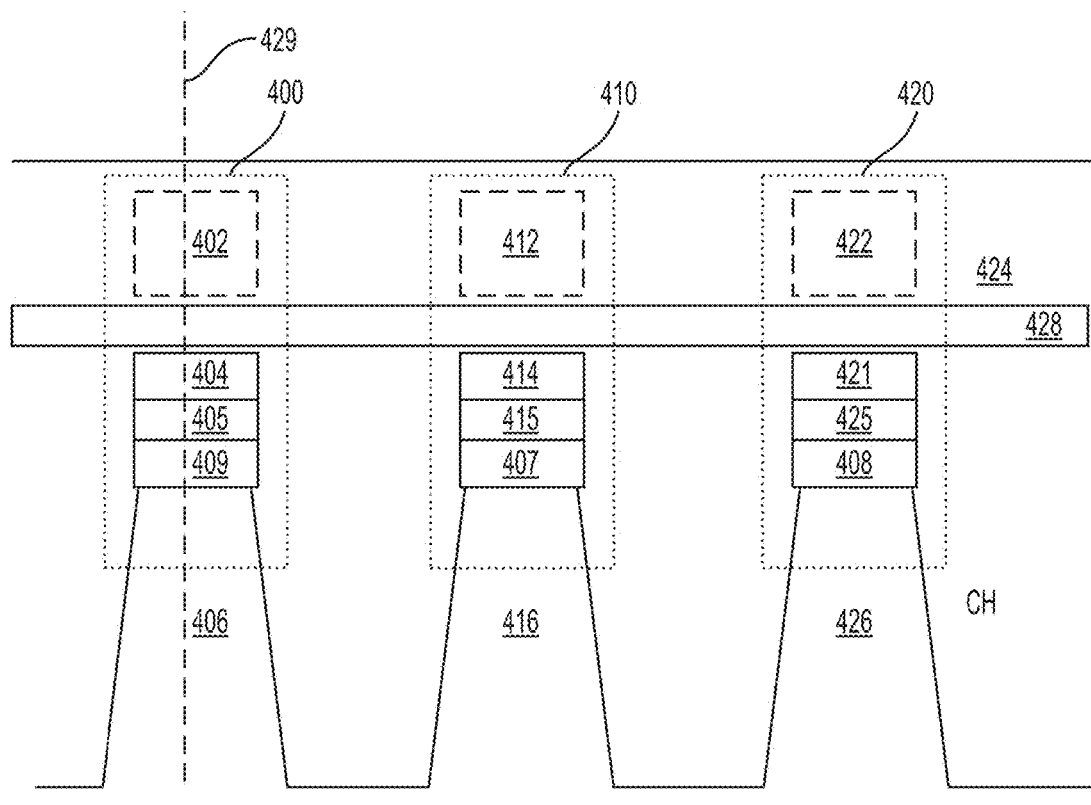
FIG. 4A depicts a cross-sectional view of example charge-trapping memory cells in NAND strings.
Figure 4B:
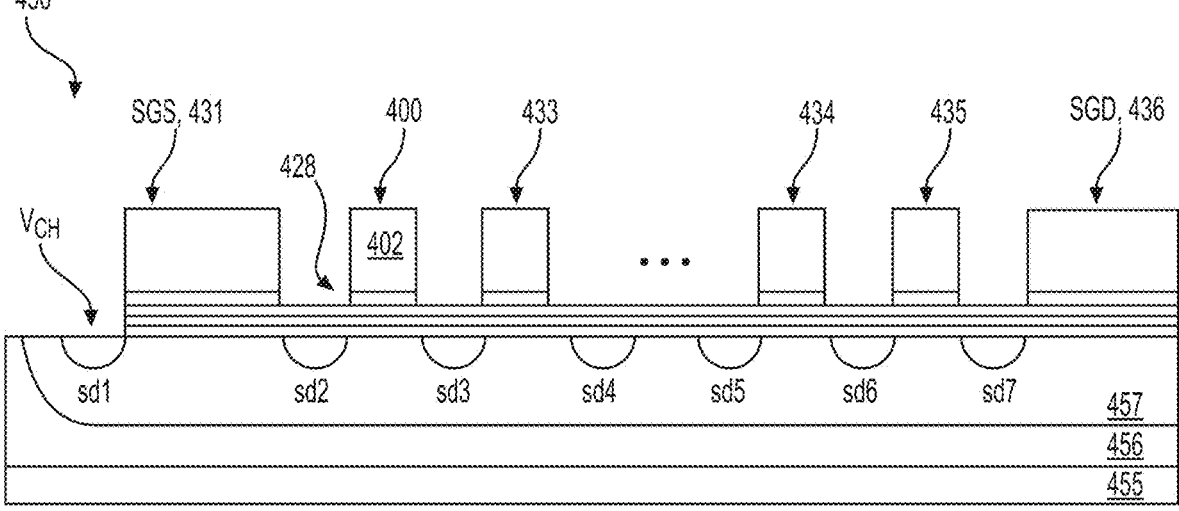
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
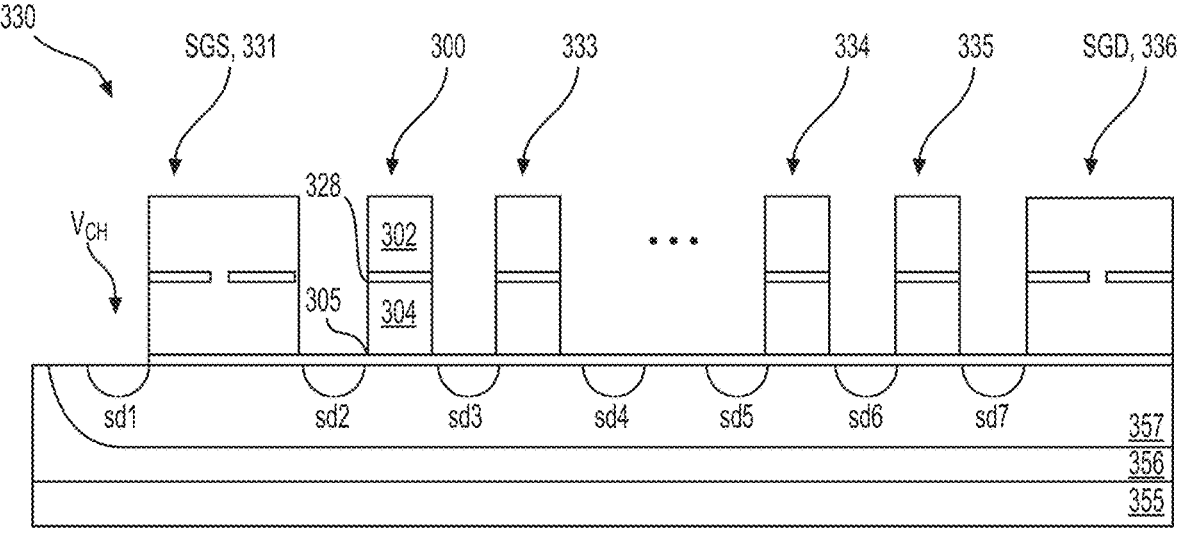
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as a SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the tunneling layer 409, the polysilicon layer 405 and a portion of the channel region 406. A memory cell 410 includes the control gate 412, the charge-trapping layer 414, the tunneling layer 407, a polysilicon layer 415 and a portion of the channel region 416. A memory cell 420 includes the control gate 422, the charge-trapping layer 421, the tunneling layer 408, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon or metal or combination of metal-silicides and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
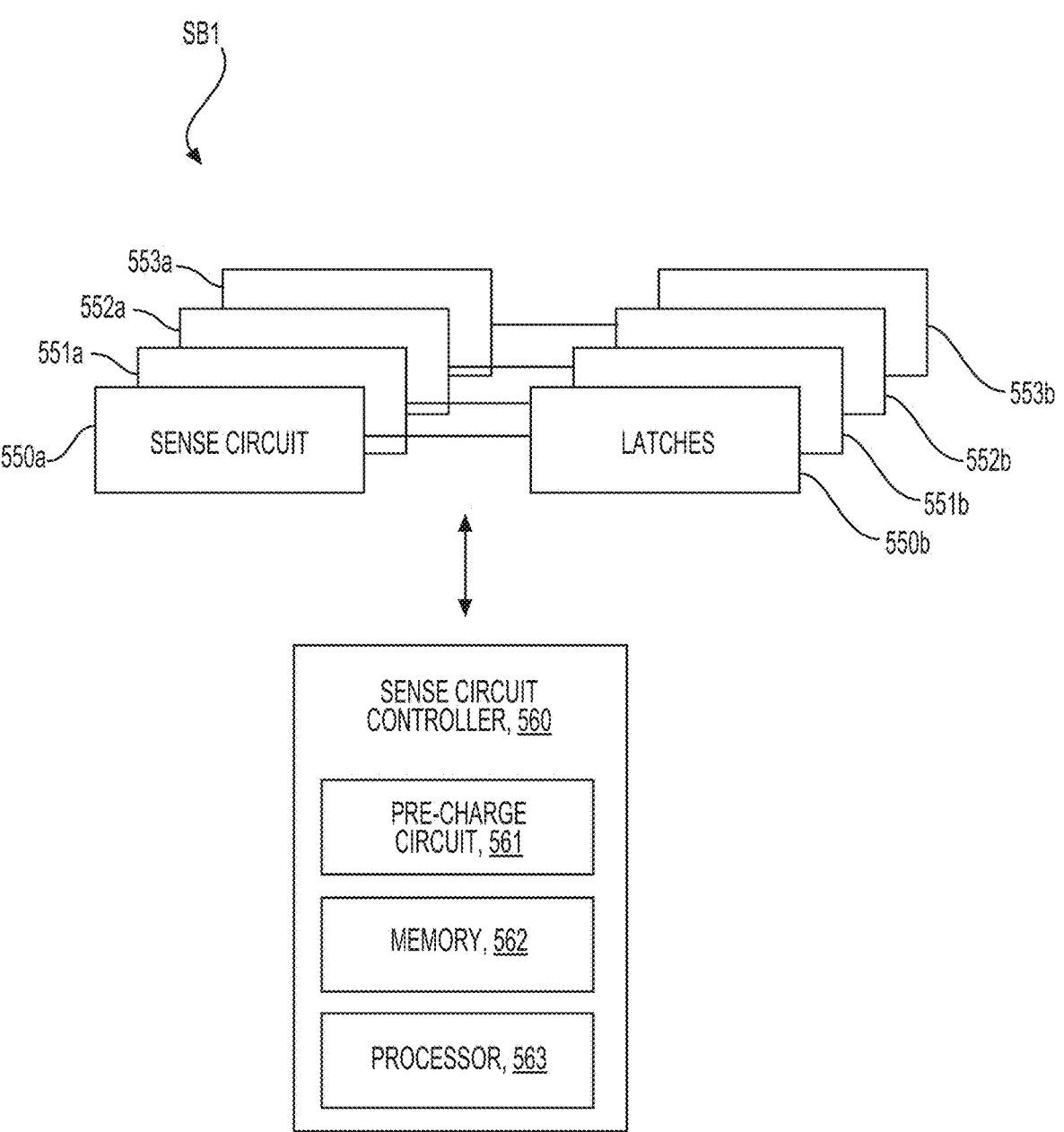
FIG. 5A depicts an example block diagram of the sense block SB1 of FIG. 1.

FIG. 5A depicts an example block diagram of the sense block SB1 of FIG. 1. In one approach, a sense block comprises multiple sense circuits. Each sense circuit is associated with data latches. For example, the example sense circuits 550a, 551a, 552a and 553a are associated with the data latches 550b, 551b, 552b and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data bus, DBUS 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

Figure 5B:
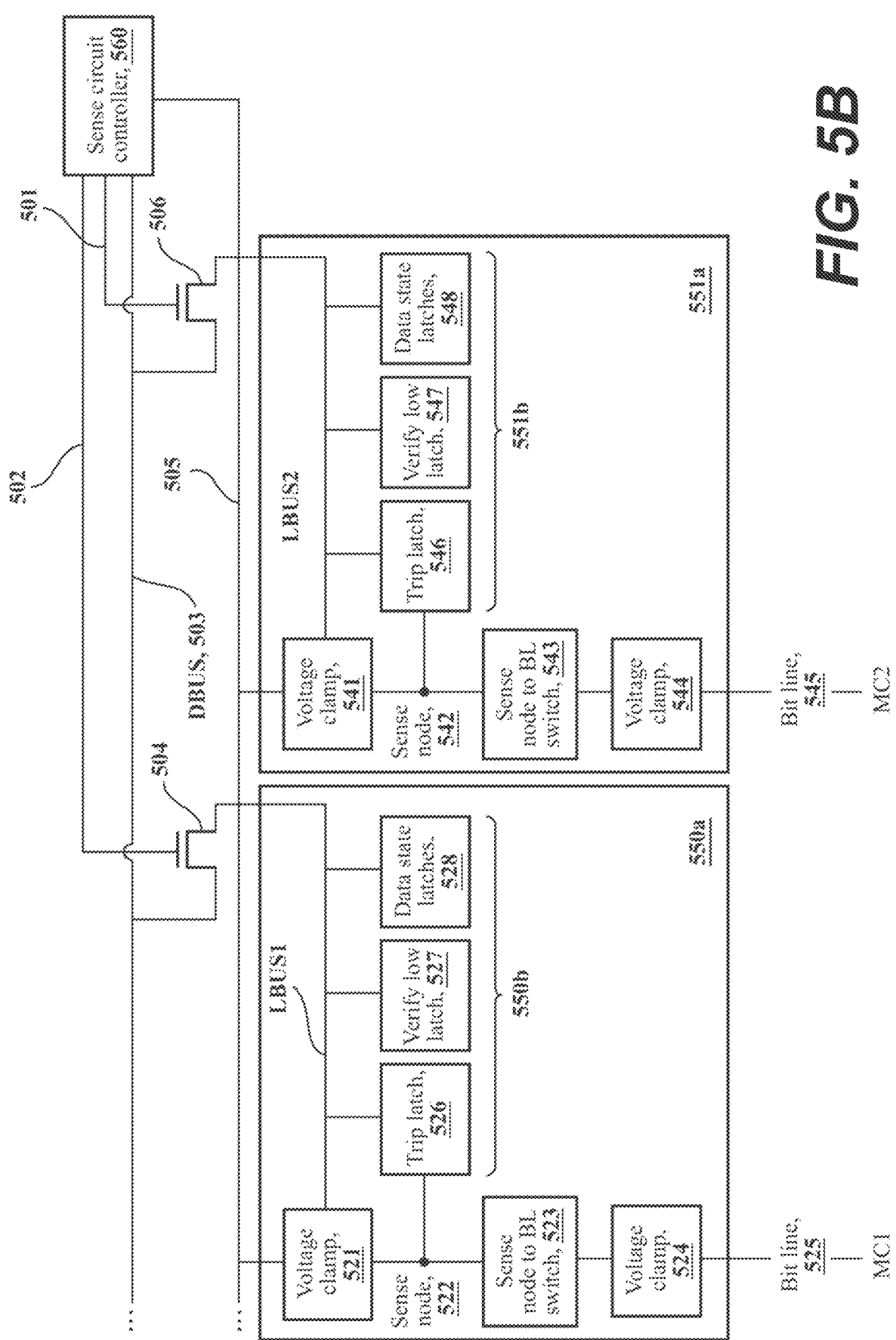
FIG. 5B depicts another example block diagram of the sense block SB1 of FIG. 1.

FIG. 5B depicts another example block diagram of the sense block SB1 of FIG. 1. The sense circuit controller 560 communicates with multiple sense circuits including example sense circuits 550a and 551a, also shown in FIG.

5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551b and the voltage clamp in some cases. To communicate with the sense circuit 551a, the sense circuit controller provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

Figure 6A:
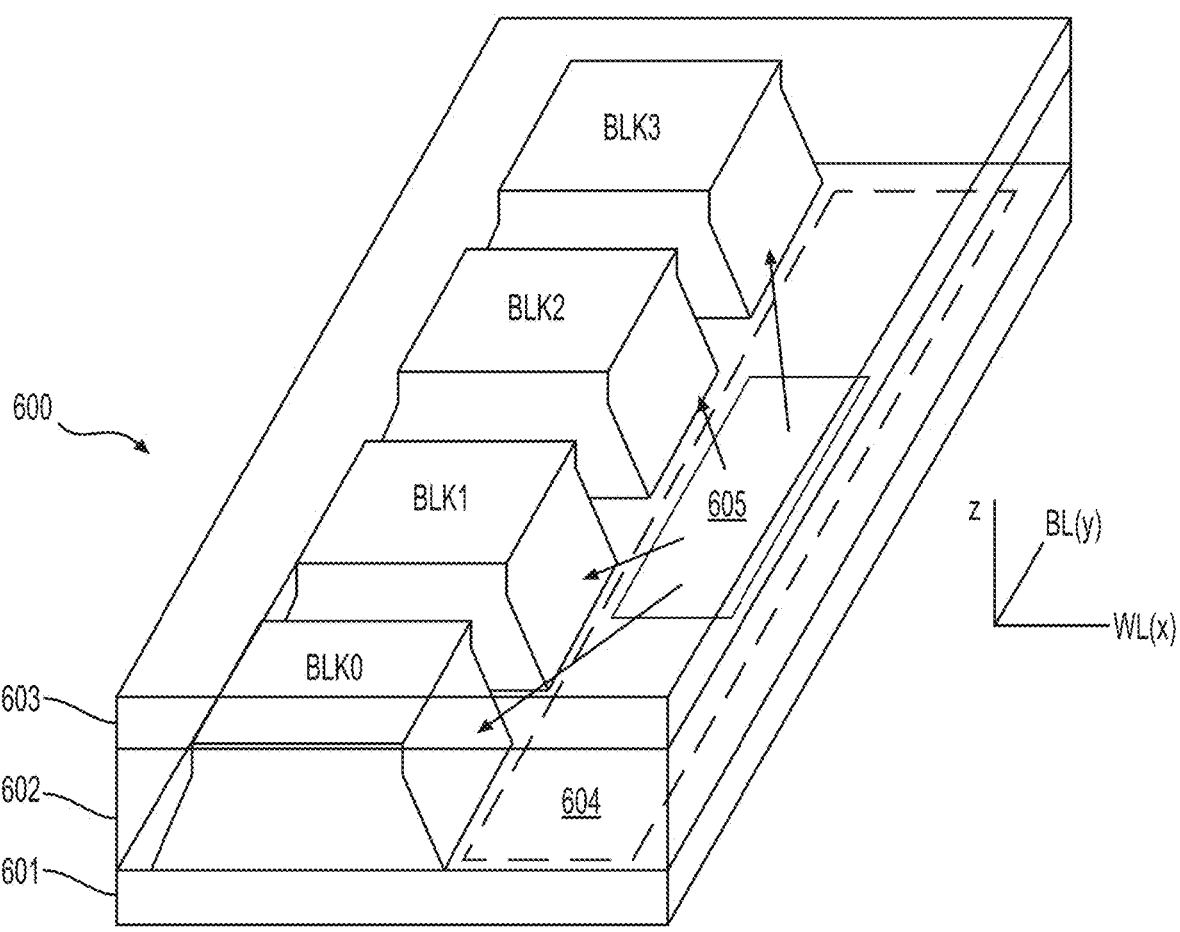
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
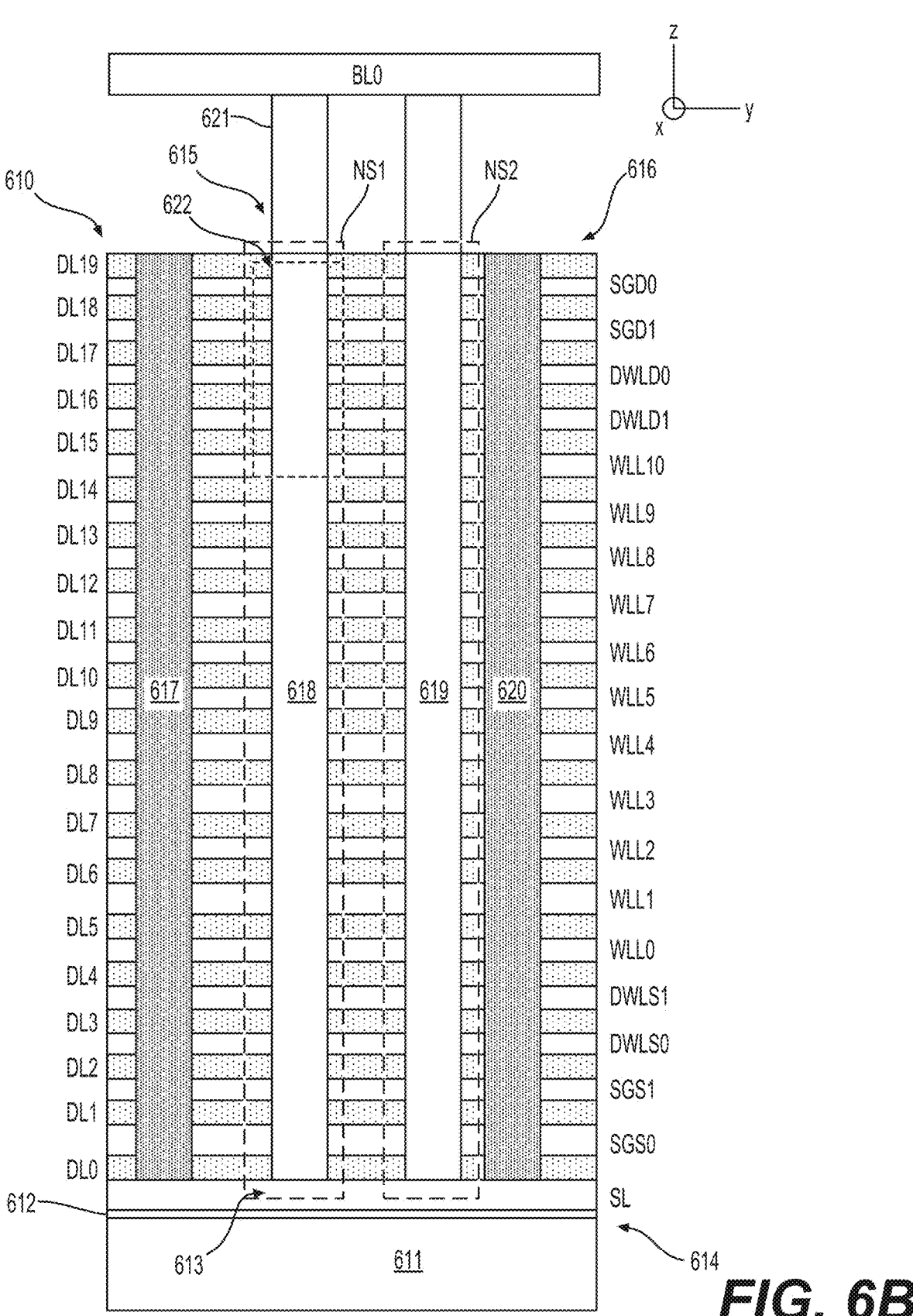
FIG. 6B depicts an example cross-sectional view of a portion of one of the blocks of FIG. 6A.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DLO-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
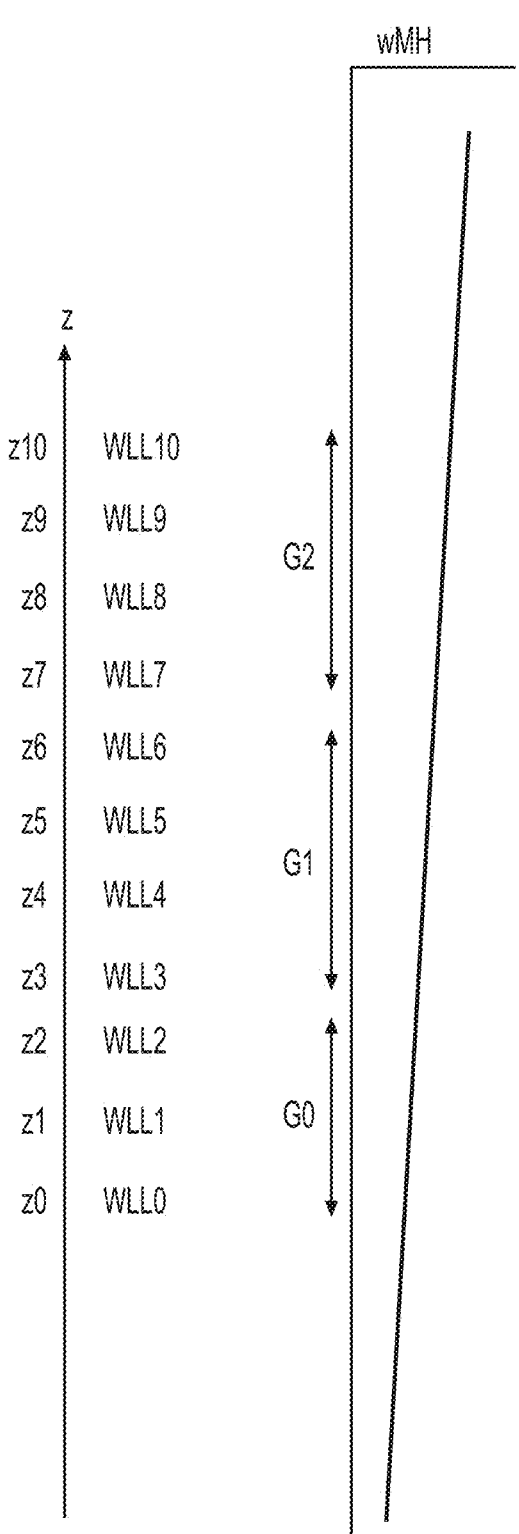
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
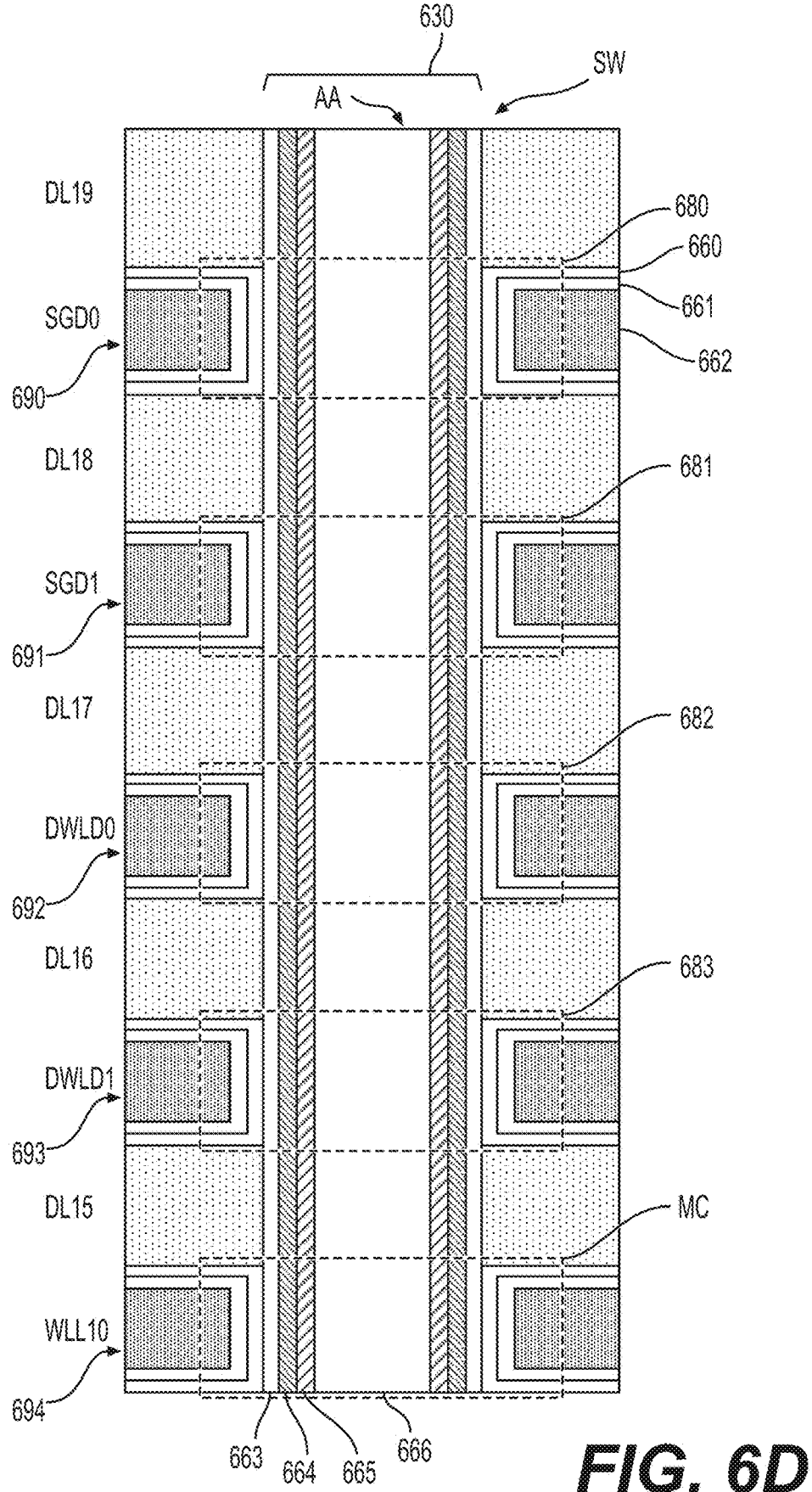
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a blocking oxide layer, a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. If each column has continuous a blocking oxide layer inside the memory hole, a word line layer has a high-k blocking oxide layer outside the memory hole followed by metal barrier 661, and a conductive metal 662. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figures 7A, 7B:
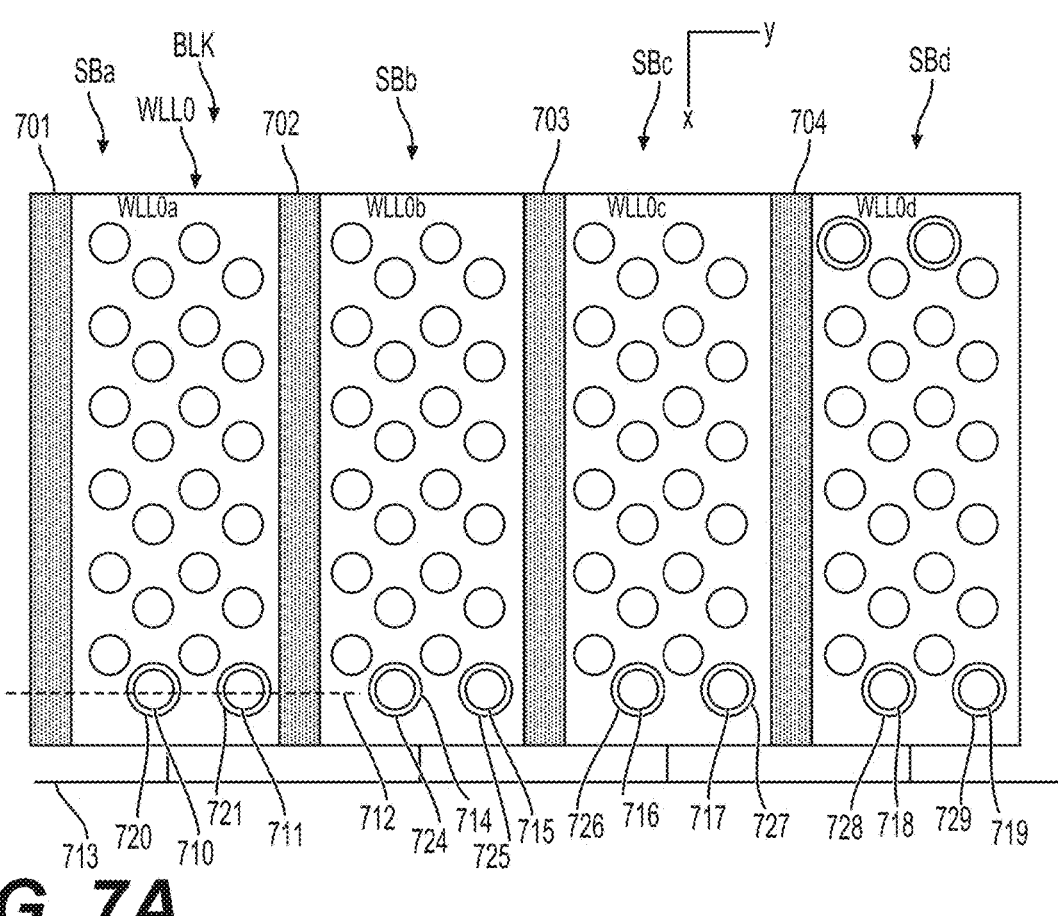
FIG. 7A depicts a top view of an example word line layer WLL0 of the stack of FIG. 6B.
FIG. 7B depicts a top view of an example top dielectric layer DL19 of the stack of FIG. 6B.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. The sub-blocks SBa, SBb, SBc and SBd may also be referred herein as a string of memory cells of a word line. As described, a string of memory cells of a word line may include a plurality of memory cells that are part of the same sub-block, and that are also disposed in the same word line layer and/or that are configured to have their control gates biased by the same word line and/or with the same word line voltage.

Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figure and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a connector 713. The last region of a word line layer in a block can be connected to a first region of a word line layer in a next block, in one approach. The connector, in turn, is connected to a voltage driver for the word line layer. The region WLL0a has example memory holes 710 and 711 along a line 712. The region WLL0b has example memory holes 714 and 715. The region WLL0c has example memory holes 716 and 717. The region WLL0d has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0a, memory cells 724 and 725 are in WLL0b, memory cells 726 and 727 are in WLL0c, and memory cells 728 and 729 are in WLL0d. These memory cells are at a common height in the stack.

Metal-filled slits 701, 702, 703 and 704 (e.g., metal interconnects) may be located between and adjacent to the edges of the regions WLL0a-WLL0d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19a, DL19b, DL19c and DL19d.

Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
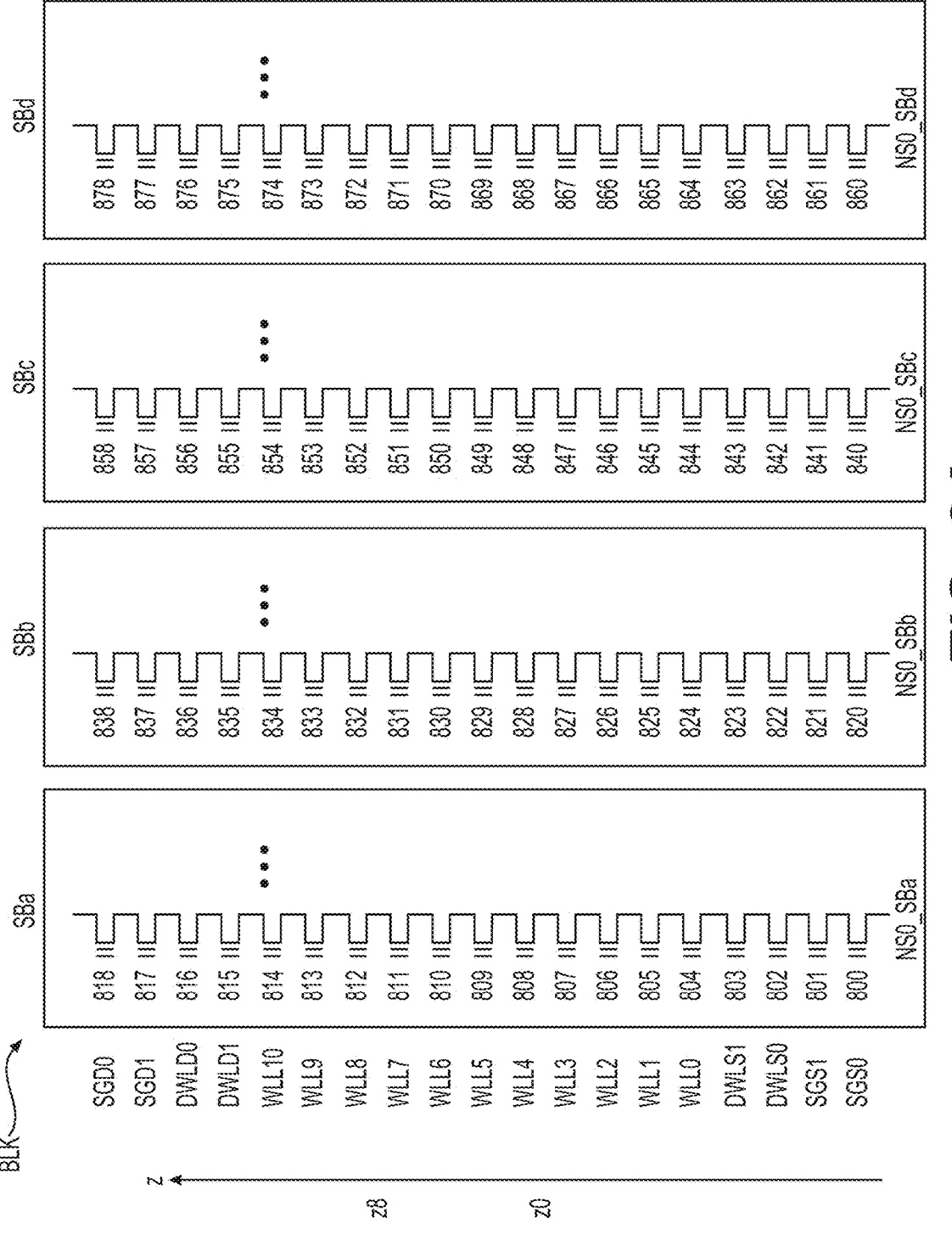
FIG. 8A depicts example NAND strings in the sub-blocks SBa-SBd of FIG. 7A.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the set of memory cells (e.g., including the memory cell 812) connected to another word line (e.g., WLL8) are at another height (z8) in the stack.

Figure 8B:
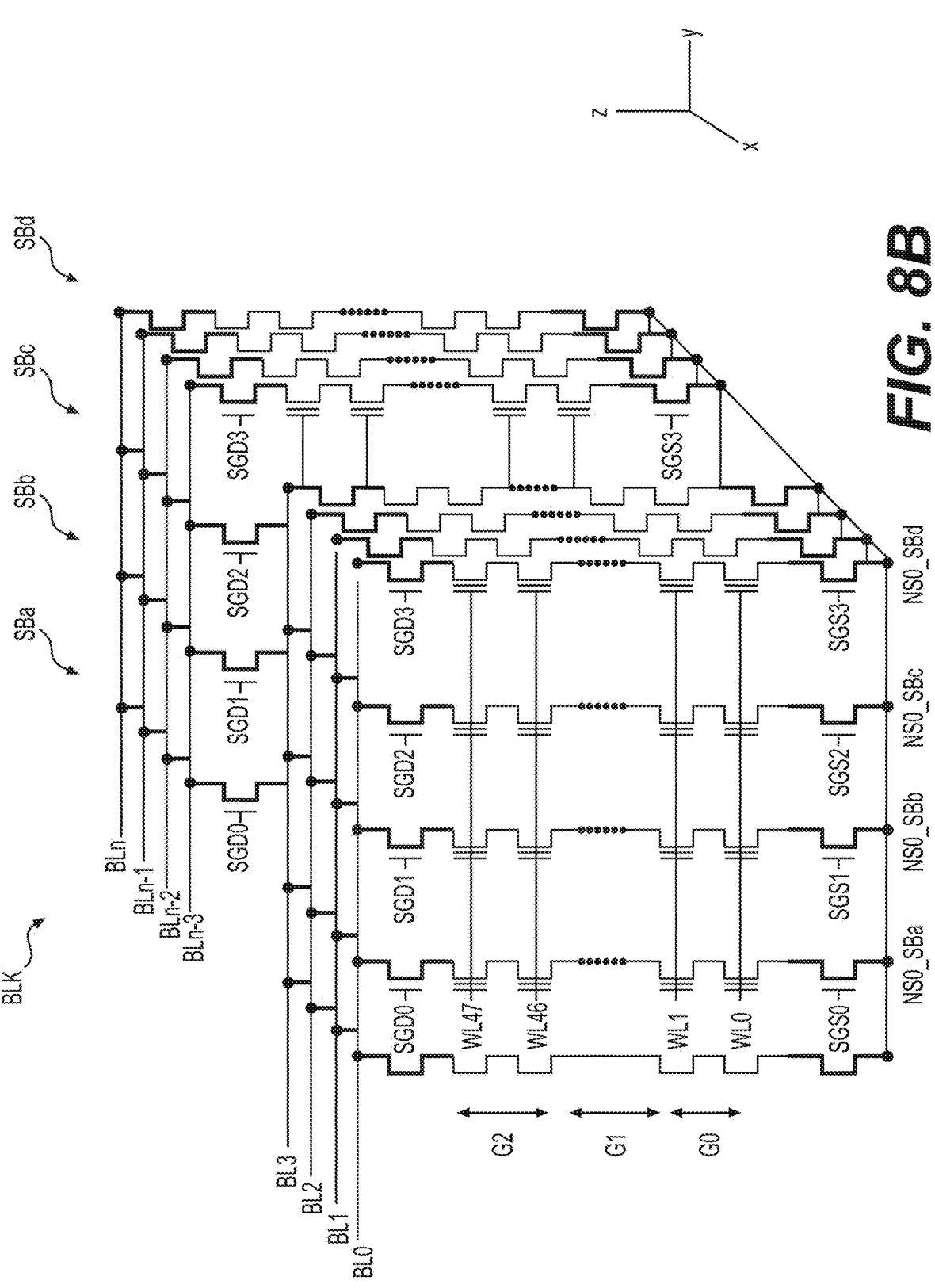
FIG. 8B depicts another example view of NAND strings in sub-blocks.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 8C:
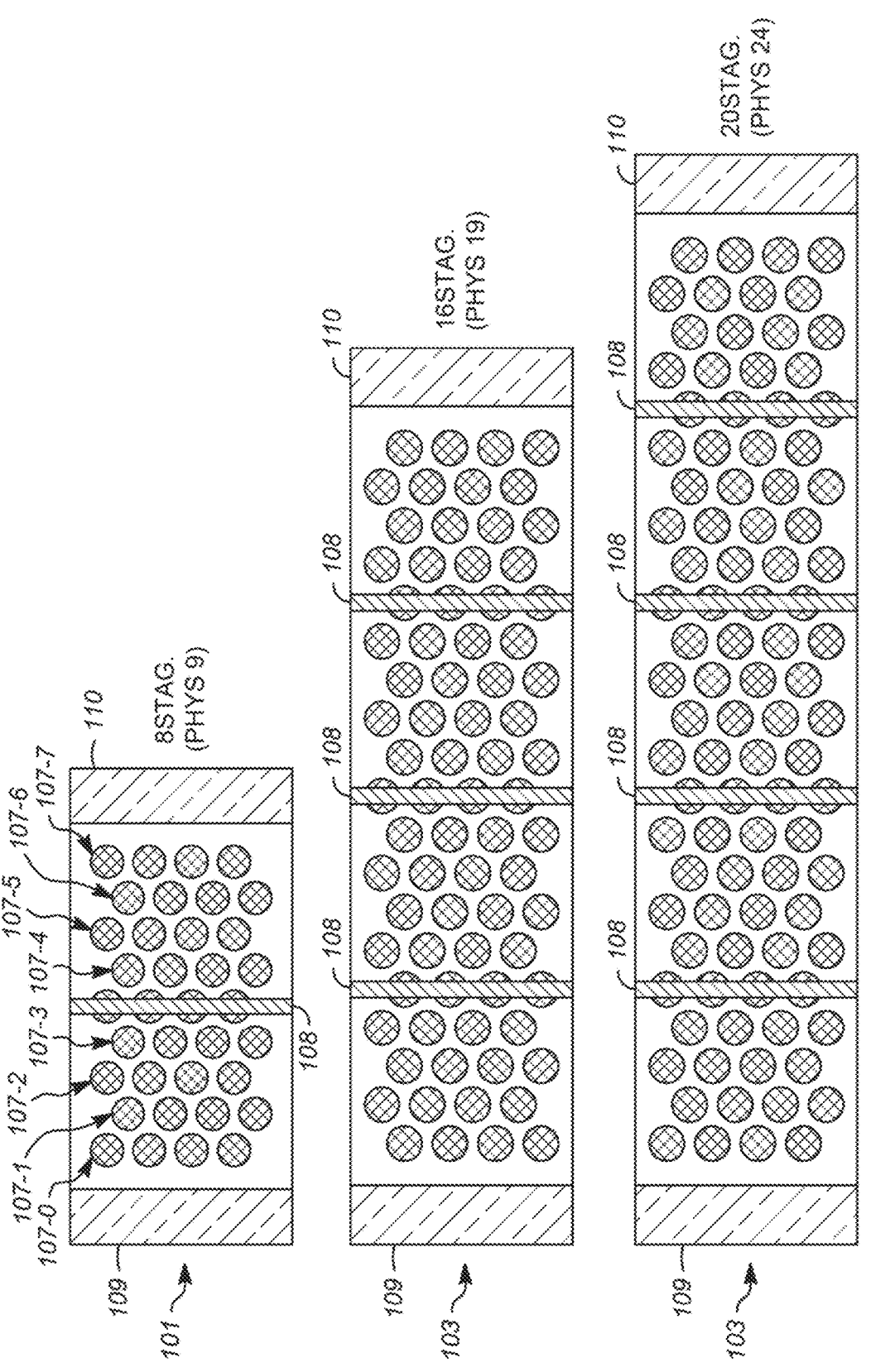
FIG. 8C depicts a top view of example word line layers of a stack.

FIG. 8C generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 are shown on a left side of a dummy row 108. A second group of rows 107-4 through 107-7 are shown on a right side of the dummy row 108. The dummy row 108 separates the two groups of rows in the staggered eight rows. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108.

These architectures 101, 103, 105 can include a chip under array structure, e.g., the control circuitry is under the memory array that can include the groups of memory strings. With the chip under array structure, the strings may include a direct strap contact for the source line for read and erase operations.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Figures 9, 10, 11:
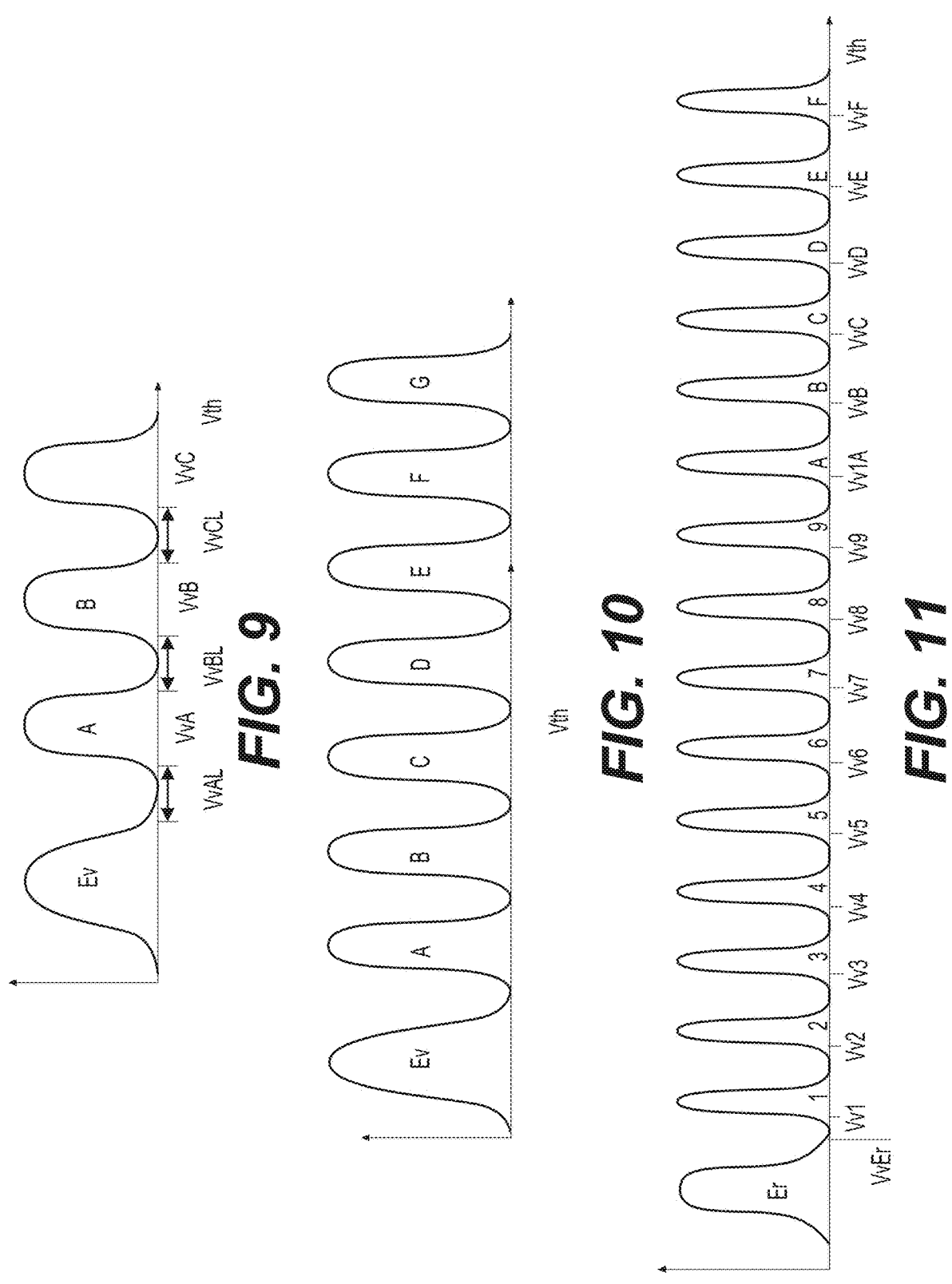
FIG. 9 depicts the Vth distributions of memory cells in an example one-pass programming operation with four data states.
FIG. 10 depicts the Vth distributions of memory cells in an example one-pass programming operation with eight data states.
FIG. 11 depicts the Vth distributions of memory cells in an example one-pass programming operation with sixteen data states.

Each memory cell may be associated with a data state according to write data in a program command. Based on its data state, a memory cell will either remain in the erased state or be programmed to a data state (a programmed data state) different from the erased state. For example, in a one-bit per cell memory device (single-level cell (SLC)), there are two data states including the erased state and one higher data state. In a two-bit per cell memory device (multi-level cell (MLC)), there are four data states including the erased state and three higher data states referred to as the A, B and C data states (see FIG. 9). In a three-bit per cell memory device (triple-level cell (TLC)), there are eight data states including the erased state and seven higher data states referred to as the A, B, C, D, E, F and G data states (see FIG. 10). In a four-bit per cell memory device (quad-level cell (QLC)), there are sixteen data states including the erased state and fifteen higher data states referred to as the Er, 1, 2, 3, 4, 5, 6, 7, 8, 9, A, B, C, D, E and F data states (see FIG. 11). Each memory cell may store a data state (e.g., a binary value) and is programmed to a threshold voltage state corresponding to the data state. Each state represents a different value and is assigned a voltage window including a range of possible threshold voltages.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and may be lower than the final verify voltage. When a memory cell is close to completion of programming, the programming speed of the memory cell may be reduced such as by elevating a voltage of a respective bit line during one or more subsequent program voltages. For example, in FIG. 9, a memory cell which is to be programmed to the A data state may be subject to verify tests at VvAL, an offset verify voltage of the A data state, and VvA, a final verify voltage of the A data state.

Figure 12:
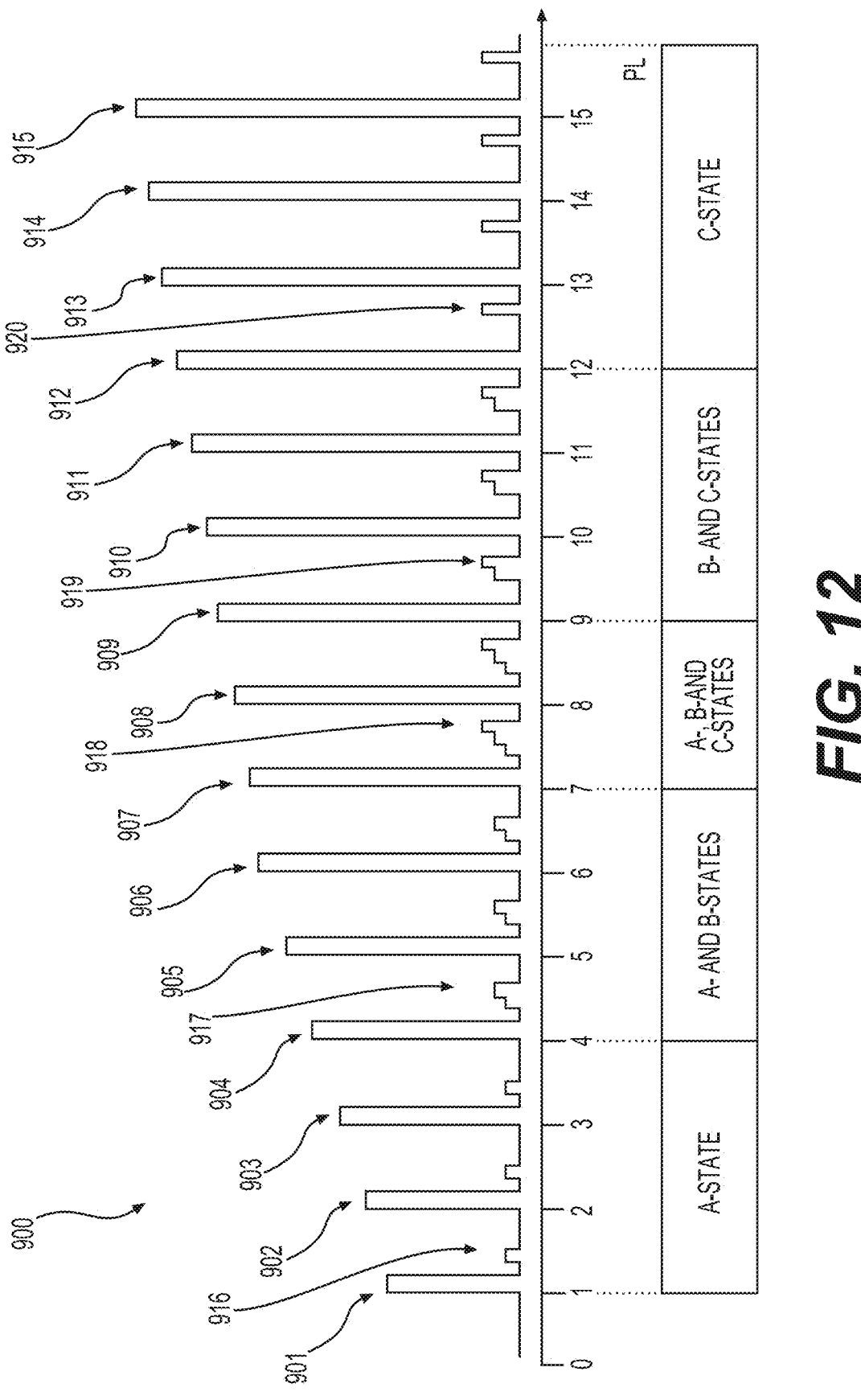
FIG. 12 is a schematic voltage waveform for an example programming operation in a memory device.

FIG. 12 depicts a waveform of an example programming operation. The horizontal axis depicts a program loop number and the vertical axis depicts control gate or word line voltage. Generally, a programming operation can involve applying a pulse train to a selected word line, where the pulse train includes multiple program loops or program-verify (PV) iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming stage in which the programming is completed. ISPP can also be used in each programming stage of a multi-stage operation.

A pulse train typically includes program voltages which increase stepwise in amplitude in each program-verify iteration using a fixed of varying step size. A new pulse train can be applied in each programming stage of a multi-stage programming operation, starting at an initial Vpgm level and ending at a final Vpgm level which does not exceed a maximum allowed level. The initial Vpgm levels can be the same or different in different programming stages. The final Vpgm levels can also be the same or different in different programming stages. The step size can be the same or different in the different programming stages. In some cases, a smaller step size is used in a final programming stage to reduce Vth distribution widths.

The pulse train 900 includes a series of program voltages 901, 902, 903, 904, 905, 906, 907, 908, 909, 910, 911, 912, 913, 914 and 915 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform or programming signal 916) may be applied after each of the first, second and third program voltages 901, 902 and 903, respectively. A- and B-state verify voltages of VvA and VvB (e.g., programming signal 917) may be applied after each of the fourth, fifth and sixth program voltages 904, 905 and 906, respectively. A-, B- and C-state verify voltages of VvA, VvB and VvC (e.g., programming signal 918) may be applied after each of the seventh and eighth program voltages 907 and 908, respectively. B- and C-state verify voltages of VvB and VvC (e.g., programming signal 919) may be applied after each of the ninth, tenth and eleventh program voltages 909, 910 and 911, respectively. Finally, a C-state verify voltage of VvC (e.g., programming signal 1020) may be applied after each of the twelfth, thirteenth, fourteenth and fifteenth program voltages 912, 913, 914 and 915, respectively.

Figures 13A, 13B:
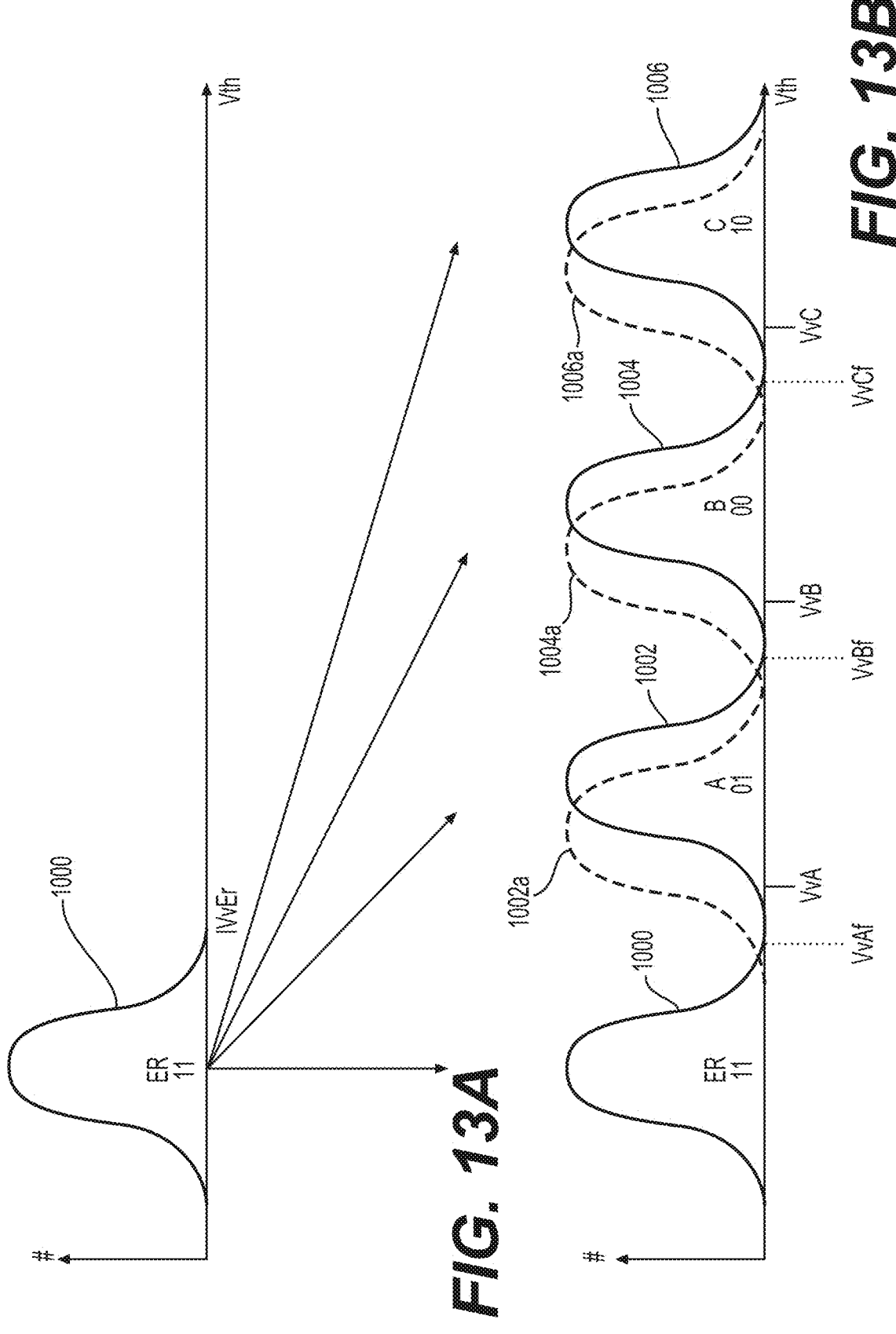
FIGS. 13A and 13B depict the Vth distributions of memory cells.

FIGS. 13A and 13B show threshold voltage (Vt) distributions of memory cells in an example two-stage programming operation. Specifically, the memory cells are initially in the erased state (bits 11) as represented by the Vth distribution 1000 shown in FIG. 13A. FIG. 13B depicts Vth distributions of memory cells after a first programming stage and a second programming stage of the example two-stage programming operation with four data states. While two programming stages and four data states are shown, it should be appreciated that any number of programming stages may be utilized (e.g., one, three or four programming stages) and any number of data states are contemplated.

Further, in 3D NAND technology, reducing the z-direction cell pitch has become an increasingly utilized strategy to mitigate the limitations imposed by the physical scaling of memory cells. This approach effectively alleviates the constraints on the memory hole etching process to some extent. However it introduces significant challenges such as increased word line interference from neighboring cells (NWI), which can adversely affect data retention and overall performance.

High bit density at a lower cost per bit remains a critical goal, and implementing multiple channel configurations in NAND arrays has gained substantial attention as a viable solution. Multiple channel configurations enhances storage capacity by enabling more bits to be stored within the same physical footprint of the memory array. Yet, multiple channel configurations are not without some drawbacks. The introduction of multiple channels creates additional sources of interference. For example, the programming change on one cell can influence the channel potential of an adjacent cell through the filler oxide used in the memory cell's construction. Embodiments disclosed herein enable mitigating such interferences.

FIG. 14 provides a top-down view of a cross-section of a memory cell, highlighting the structure of a dual cell setup facilitated by split-channel, split-gate architecture. The components illustrated in FIG. 14 are integral to the functionality of memory cells devices. For example, at the core of FIG. 14, the "Poly channel" denotes the polysilicon channel that runs vertically through the memory cell stack. The channel may act as a conduit for electrons during the operation of the memory cells and the transfer and trapping of electrons. Surrounding the poly channel is the "Tunnel layer." The "Tunnel layer" is an oxide layer that allows for the controlled movement (i.e., tunneling) of electrons between the polysilicon channel and the charge trapping layer. The "Trap layer," shown above the tunnel layer, is designed to capture and hold electrons. The stored charge in this layer represents the stored data. The outermost "Block layer" serves to protect the charges stored in the trap layer and acts as a barrier to prevent the charge from escaping.

As further depicted in FIG. 14, memory cell 1 and memory cell 2 are formed by the split channel configuration and separated by an "Oxide" layer. This layer may be made of silicon dioxide and serve as an insulator and isolates the poly channel. Memory cell 1 and memory cell 2 can be addressed and operated independently due to the split gate and channel configuration.

FIGS. 15A and 15B illustrate schematic cell structures and plane view of the semicircular split-gate floating gate cells. As shown in FIGS. 15A and 15B, the floating gate is completely isolated for each memory cell, which eliminates charge migration across adjacent cells. In addition, the conductive storage layers placed between the Control Gate (CG) and the channel act as electric field shields, hence mitigating the parasitic turn-on at the semicircular gate edges.

Embodiments disclosed herein are directed to techniques aimed at managing interference in a 3D NAND memory with a split or multiple channel configuration. Specifically, it addresses how programming one memory cell (e.g., cell 1) before another cell (e.g., cell 2) in a closely configured environment can lead to interference. The interference occurs because the act of programming cell 2 may inadvertently shift the voltage threshold (Vt) of cell 1.

To mitigate this, in accordance with embodiments disclosed herein, one technique involves applying a positive bias to cell 1 when reading it after cell 2 has been programmed. This bias helps recover the original threshold voltage of cell 1, ensuring accurate read operations.

In accordance with embodiments disclosed herein, another technique involves performing a preliminary read of a memory cell on WLn+1 and the opposing cell of cell 2. This preliminary read operation may include detecting whether the threshold voltage of these memory cells are high or low. The purpose of the preliminary read operation is not necessarily to capture an exact Vt. For example, results of the preliminary read may be compared against a reference level. If the result is above a certain threshold, the cell may be considered to have a "high Vt" or a "low Vt." The preliminary read operation may be faster than full read operation, as preliminary read operations may not require precise quantification of Vt, but rather a determination if the Vt is above or below a certain critical level.

Further, a zone of a plurality of zones is determined for cell 1 based on the pre-read Vt states. For example, each zone corresponds to a different combination of Vt states for the memory cell on WLn+1 and the opposing cell 2. Each zone corresponds to varying levels of NWI. For example, with reference to FIG. 16, the plurality of zones include: for zone 4, both cells have low Vt; for zone 3, WLn+1 is low and opposing cell 2 is high; for zone 2, WLn+1 is high and opposing cell 2 is low; and for zone 1, both cells have high Vt.

Figures 16, 17, 18:
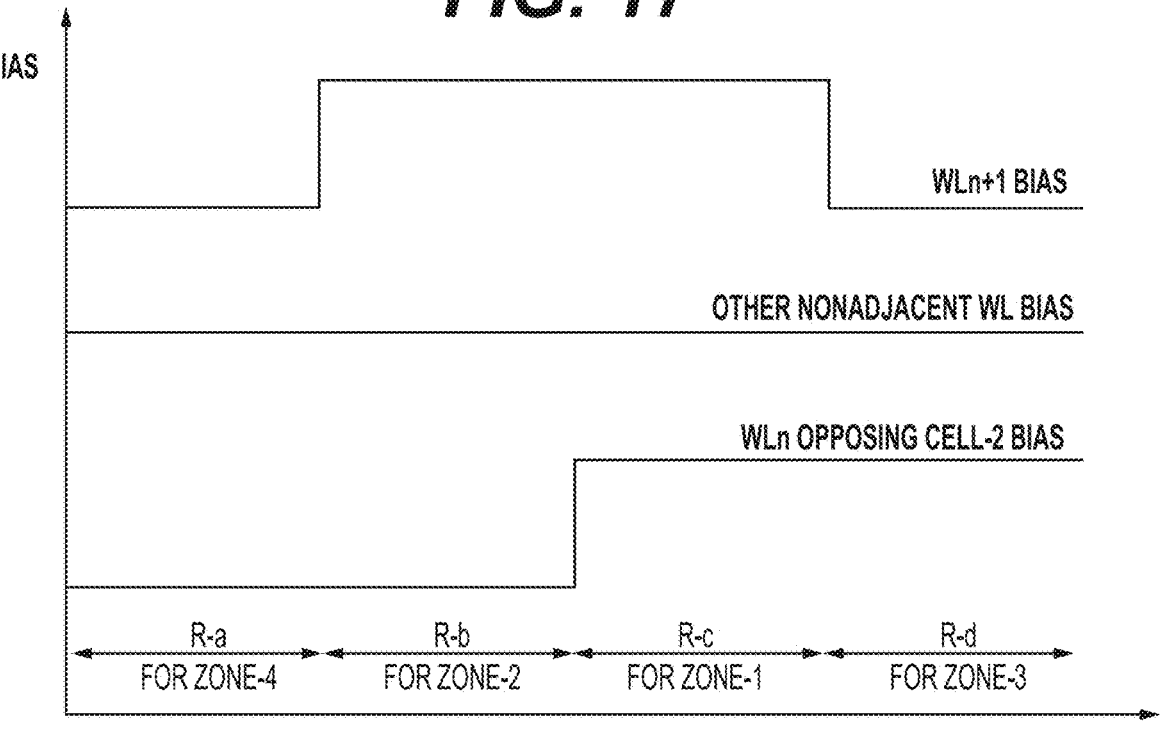
FIGS. 16 and 17 illustrates an exemplary schemes of a plurality of zones, in accordance with embodiments described herein.
FIG. 18 illustrates an exemplary timing chart for wordline biases, in accordance with embodiments described herein.

As another example, with reference to FIG. 17, the plurality of zones may be defined based on whether the threshold voltage of these memory cells are high, medium, or low. As shown in FIG. 17, in some embodiments, zones are defined as: for zone 4, both cells have low Vt; for zone 3, WLn+1 is low and opposing cell 2 is high or medium; for zone 2, WLn+1 is high or medium and opposing cell 2 is low; and for zone 1, both cells either have high or medium Vt.

Then multiple reads may be conducted under different bias conditions. For example, with reference to FIG. 18 selected WLn is read four times with different word line bias on WLn+1 and opposing cell 2 in WLn. The appropriate read result for cell 1 is selected based on the zone determined for cell 1. For example, based on zone definitions in FIG. 18, if cell 1 is located at zone 1, cell 1 would suffer the highest NWI, then the result corresponding to the R-c read in FIG. 18 would be selected. As another example, if the cell 1 is located at zone 2, NWI is mainly induced by WLn+1, so the read result corresponding to R-b read in FIG. 18 would be selected.

FIG. 19 illustrates steps of one example method 1900 for managing interference in a 3D NAND memory. For example, with reference to FIGS. 1A and 1B, the controller 122, the control circuitry 110, the control circuit 150, and/or other circuitry described herein, respectively or collectively, are configured to perform the method 1900. In some examples, a processor or processing device is configured to perform the method 1900. In other examples, two or more processors or processing devices are configured to perform the method 1900, either individually or collectively (e.g., with different processors or processing devices performing different steps of the method 1900).

As shown in FIG. 19, method 1900 starts at step 1902. In step 1902, in response to a read operation, a first memory cell of an adjacent memory cell pair of the plurality of adjacent memory cell pairs is biased.

In FIG. 19, in step 1904, a read operation is performed on a second memory cell of an adjacent memory cell pair.

FIG. 20 illustrates steps of another example method 2000 for managing interference in a 3D NAND memory. For example, with reference to FIGS. 1A and 1B, the controller 122, the control circuitry 110, the control circuit 150, and/or other circuitry described herein, respectively or collectively, are configured to perform the method 2000. In some examples, a processor or processing device is configured to perform the method 2000. In other examples, two or more processors or processing devices are configured to perform the method 2000, either individually or collectively (e.g., with different processors or processing devices performing different steps of the method 200).

As shown in FIG. 20, method 2000 starts at step 2002. In step 2002, preliminary read operations is performed on a first memory cell of an adjacent memory cell pair of the plurality of adjacent memory cell pairs and on a neighboring memory cell of a second memory cell of the adjacent memory cell pair, the preliminary read operations detecting charge states of the first memory cell and the neighboring memory cell In FIG. 20, in step 2004, a plurality of read operations are performed on the second memory cell, wherein in each read operation of the plurality of read operations comprises applying different combinations of voltage biases to the first memory cell and the neighboring memory cell.

In FIG. 20, in step 2006, based on the charge states, a read result of the plurality of read operations is selected.

Structures such as those shown with reference to FIGS. 1A and 1B for programming selection gates included within NAND strings of a non-volatile memory circuit may also be referred to using functional language. In some embodiments, these structures may be described as including: "a means for biasing a first memory cell of an adjacent memory cell pair of the plurality of adjacent memory cell pairs in response to a read operation"; "a means for performing a read operation on a second memory cell of an adjacent memory cell pair"; "a means for performing a program operation on the first memory cell"; "a means for performing a program operation on the second memory cell subsequent to programming the first memory cell"; and "a means for positively biasing the first memory cell."

The corresponding structure for "a means for biasing a first memory cell of an adjacent memory cell pair of the plurality of adjacent memory cell pairs in response to a read operation" is the controller 122, the control circuitry 110, the control circuit 150 as well as the equivalents of this circuit. The corresponding structure for "a means for performing a read operation on a second memory cell of an adjacent memory cell pair" is the controller 122, the control circuitry 110, the control circuit 150 as well as the equivalents of this circuit. The corresponding structure for "a means for performing a program operation on the first memory cell" is the controller 122, the control circuitry 110, the control circuit 150 as well as the equivalents of this circuit. The corresponding structure for "a means for performing a program operation on the second memory cell subsequent to programming the first memory cell" is the controller 122, the control circuitry 110, the control circuit 150 as well as the equivalents of this circuit. The corresponding structure for "a means for positively biasing the first memory cell" is the controller 122, the control circuitry 110, the control circuit 150 as well as the equivalents of this circuit.

The foregoing detailed description of the embodiments has been presented for purposes of illustration and description. It is not intended to be exhaustive or to limit the embodiments to the precise form disclosed. Many modifications and variations are possible in light of the above teachings. The described embodiments were chosen in order to best explain the principles of the embodiments and its practical application, to thereby enable others skilled in the art to best utilize the embodiments in various embodiments and with various modifications as are suited to the particular use contemplated. It is intended that the scope of the embodiments be defined by the claims appended hereto.

What is claimed is:

1. A semiconductor device, comprising:
  a substrate;
  a three-dimensional memory array disposed on the substrate, comprising:
    a plurality of memory cell stacks aligned along a vertical direction perpendicular to the substrate, each stack of the plurality of memory cell stacks including multiple, connected memory cells arranged in layers, each layer forming a plane perpendicular to the vertical direction of the plurality of memory cell stacks;

wherein adjacent memory cell stacks of the plurality of memory cell stacks are configured such that each memory cell in a given layer of a first memory cell stack of the plurality of memory cell stacks is adjacent to a corresponding memory cell in a same layer of a second memory cell stack of the plurality of memory cell stacks forming a plurality of adjacent memory cell pairs, each adjacent memory cell pair of the plurality of adjacent memory cell pairs being separated by a non-conductive layer and including a first memory cell and a second memory cell, the memory cells including a neighboring memory cell of the second memory cell located immediately adjacent to the second memory cell in a same memory cell stack of the plurality of memory cell stacks; and a control circuit configured to:

perform preliminary read operations on the first memory cell and on the neighboring memory cell, the preliminary read operations detecting charge states of the first memory cell and the neighboring memory cell;

perform a plurality of read operations on the second memory cell, wherein in each read operation of the plurality of read operations comprises applying different combinations of voltage biases to the first memory cell and the neighboring memory cell; and select, based on the charge states, a read result of the plurality of read operations.

2. The semiconductor device of claim 1, wherein the control circuit is further configured to:

perform a program operation on the first memory cell.

3. The semiconductor device of claim 2, wherein the control circuit is further configured to:

subsequent to programming the first memory cell, perform a program operation on the second memory cell.

4. The semiconductor device of claim 1, wherein the control circuit is further configured to:

positively bias the first memory cell.

5. The semiconductor device of claim 1, wherein the three-dimensional memory array comprises:

a multiple-channel structure that extends through the three-dimensional memory array along the vertical direction perpendicular to the substrate, wherein a cross-section of the multiple-channel structure is perpendicular to the vertical direction and includes channel layer sections spaced apart from each other, and wherein a first channel layer section is associated with the first memory cell and a second channel layer section is associated with the second memory cell.

6. The semiconductor device of claim 1, wherein the three-dimensional memory array comprises:

a split-gate configuration comprising separate gate sections such that each memory cell of the plurality of adjacent memory cell pairs is associated with a separate gate section enabling independent control of memory cells of any memory cell pairs.

7. The semiconductor device of claim 6, wherein separate gate sections associated with each adjacent memory cell pair of the plurality of adjacent memory cell pairs are spaced apart from each other.

8. A method of operating a non-volatile semiconductor memory device, the method comprising:

performing preliminary read operations on a first memory cell of an adjacent memory cell pair of a plurality of adjacent memory cell pairs and on a neighboring memory cell of a second memory cell of the adjacent memory cell pair, wherein the neighboring memory cell is located immediately adjacent to the second memory cell in a same memory cell stack of a plurality of memory cell stacks, the preliminary read operations detecting charge states of the first memory cell and the neighboring memory cell, and wherein adjacent memory cell stacks of the plurality of memory cell stacks are configured such that each memory cell in a given layer of a first memory cell stack of the plurality of memory cell stacks is adjacent to a corresponding memory cell in a same layer of a second memory cell stack of the plurality of memory cell stacks forming the plurality of adjacent memory cell pairs, each adjacent memory cell pair of the plurality of adjacent memory cell pairs being separated by a non-conductive layer;

performing a plurality of read operations on the second memory cell, wherein in each read operation of the plurality of read operations comprises applying different combinations of voltage biases to the first memory cell and the neighboring memory cell; and selecting, based on the charge states, a read result of the plurality of read operations.

9. The method of claim 8, further comprising:

performing a program operation on the first memory cell.

10. The method of claim 9, further comprising:

subsequent to programming the first memory cell, performing a program operation on the second memory cell.

11. The method of claim 8, further comprising:

positively biasing the first memory cell.

12. The method of claim 8, wherein the plurality of memory cell stacks belong to a three-dimensional memory array disposed on a substrate, wherein the plurality of memory cell stacks are aligned along a vertical direction perpendicular to the substrate, each stack of the plurality of memory cell stacks including multiple, connected memory cells arranged in layers, each layer forming a plane perpendicular to the vertical direction of the plurality of memory cell stacks.

13. The method of claim 12, wherein the three-dimensional memory array comprises:

a multiple-channel structure that extends through the three-dimensional memory array along the vertical direction perpendicular to the substrate, wherein a cross-section of the multiple-channel structure is perpendicular to the vertical direction and includes channel layer sections spaced apart from each other, and wherein a first channel layer section is associated with the first memory cell and a second channel layer section is associated with the second memory cell.

14. The method of claim 12, wherein the three-dimensional memory array comprises:

a split-gate configuration comprising separate gate sections such that each memory cell of the plurality of adjacent memory cell pairs is associated with a separate gate section enabling independent control of memory cells of any memory cell pairs.

15. An apparatus, comprising:

a substrate;

a three-dimensional memory array disposed on the substrate, comprising:

a plurality of memory cell stacks aligned along a vertical direction perpendicular to the substrate, each stack of the plurality of memory cell stacks including multiple, connected memory cells arranged in layers, each layer forming a plane perpendicular to the vertical direction of the plurality of memory cell stacks;

wherein adjacent memory cell stacks of the plurality of memory cell stacks are configured such that each memory cell in a given layer of a first memory cell stack of the plurality of memory cell stacks is adjacent to a corresponding memory cell in a same layer of a second memory cell stack of the plurality of memory cell stacks forming a plurality of adjacent memory cell pairs, each adjacent memory cell pair of the plurality of adjacent memory cell pairs being separated by a non-conductive layer and including a first memory cell and a second memory cell, the memory cells including a neighboring memory cell of the second memory cell located immediately adjacent to the second memory cell in a same memory cell stack of the plurality of memory cell stacks; and a means for performing preliminary read operations on the first memory cell and on the neighboring memory cell, the preliminary read operations detecting charge states of the first memory cell and the neighboring memory cell;

a means for performing a plurality of read operations on the second memory cell, wherein in each read operation of the plurality of read operations comprises applying different combinations of voltage biases to the first memory cell and the neighboring memory cell; and a means for selecting, based on the charge states, a read result of the plurality of read operations.

16. The apparatus of claim 15, further comprising:

a means for performing a program operation on the first memory cell.

17. The apparatus of claim 16, further comprising:

a means for performing a program operation on the second memory cell subsequent to programming the first memory cell.

18. The apparatus of claim 15, a means for positively biasing the first memory cell.

19. The apparatus of claim 15, wherein the three-dimensional memory array comprises:

a multiple-channel structure that extends through the three-dimensional memory array along the vertical direction perpendicular to the substrate, wherein a cross-section of the multiple-channel structure is perpendicular to the vertical direction and includes channel layer sections spaced apart from each other, and wherein a first channel layer section is associated with the first memory cell and a second channel layer section is associated with the second memory cell.

20. The apparatus of claim 15, wherein the three-dimensional memory array comprises:

a split-gate configuration comprising separate gate sections such that each memory cell of the plurality of adjacent memory cell pairs is associated with a separate gate section enabling independent control of memory cells of any memory cell pairs.

* * * * *